United States Patent
Zhang et al.

(10) Patent No.: US 10,185,216 B2
(45) Date of Patent: Jan. 22, 2019

(54) MASK SHEET AND METHOD OF MANUFACTURING MASK SHEET

(71) Applicants: BOE Technology Group Co., Ltd., Beijing (CN); Hefei Xinsheng Optoelectronics Technology Co., Ltd., Anhui (CN)

(72) Inventors: Shenjun Zhang, Beijing (CN); Guofeng Weng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 103 days.

(21) Appl. No.: 15/323,171

(22) PCT Filed: Feb. 19, 2016

(86) PCT No.: PCT/CN2016/074113
§ 371 (c)(1),
(2) Date: Dec. 30, 2016

(87) PCT Pub. No.: WO2016/161847
PCT Pub. Date: Oct. 13, 2016

(65) Prior Publication Data
US 2017/0139319 A1  May 18, 2017

(30) Foreign Application Priority Data
Apr. 10, 2015 (CN) .......................... 2015 1 0169291

(51) Int. Cl.
*G03F 1/38* (2012.01)
*G03F 1/76* (2012.01)
*H01L 51/00* (2006.01)

(52) U.S. Cl.
CPC .................. *G03F 1/38* (2013.01); *G03F 1/76* (2013.01); *H01L 51/0011* (2013.01)

(58) Field of Classification Search
CPC ...................................... G03F 1/38; G03F 1/76
USPC ............................................................. 430/5
See application file for complete search history.

(56) References Cited

FOREIGN PATENT DOCUMENTS

| CN | 201974631 U | 9/2011 |
|---|---|---|
| CN | 103592815 A | 2/2014 |
| CN | 104076599 A | 10/2014 |
| CN | 104779145 A | 7/2015 |
| JP | H08-110193 A | 4/1996 |
| JP | 2009-230126 A | 10/2009 |

OTHER PUBLICATIONS

Second Office Action from Chinese Patent Application No. 201510169291.1, dated May 16, 2017, 4 pages.
First Office Action, including Search Report, for Chinese Patent Application No. 201510169291.1, dated Feb. 6, 2017, 8 pages.
International Search Report and Written Opinion of International Application No. PCT/CN2016/074113, dated May 25, 2016, 6 pages.
English translation of Box No. V of the Written Opinion for the International Searching Authority for International Application No. PCT/CN2016/074113, 2 pages.

*Primary Examiner* — Christopher G Young
(74) *Attorney, Agent, or Firm* — Westman, Champlin & Koehler, P.A.

(57) ABSTRACT

The present disclosure discloses a mask sheet and a method of manufacturing a mask sheet, which belong to display technique field. The mask sheet includes a light shielding region and a light transmitting region. The light shielding region includes an adjoining portion which is located at a position where the light shielding region adjoins the light transmitting region, and thickness of other portion of the light shielding region of the mask sheet except the adjoining portion is greater than that of the adjoining portion of the mask sheet.

13 Claims, 5 Drawing Sheets

MASK SHEET AND METHOD OF MANUFACTURING MASK SHEET

CROSS-REFERENCE TO RELATED APPLICATIONS

This application is a Section 371 National Stage Application of International Application No. PCT/CN2016/074113, filed on Feb. 19, 2016, published as WO 2016/161847 A1 on Oct. 13, 2016, entitled "Mask Sheet and Method of Manufacturing Mask Sheet", which claims priority to Chinese Application No. 201510169291.1, filed on Apr. 10, 2015, incorporated herein by reference in their entirety.

BACKGROUND

1. Technical Field

The present disclosure relates to field of display technology, and particularly to a mask sheet and a method of manufacturing the same.

2. Description of the Related Art

During manufacturing an organic light emitting diode display device, formation of a pattern that is requested during evaporation for manufacturing a substrate by using a mask sheet is very important. The mask sheet includes a light shielding region and a light transmitting region. The light shielding region is provided with a plurality of light shielding layers located at different zones and configured for light shielding. Recently, with development of high-resolution display technology, a low-scale high accurate Fine Metal Mask is widely received attention.

During manufacturing the conventional fine metal mask, generally, the mask is firstly subjected to processes of coating, exposure, development and etching to manufacture a pattern that is needed during evaporation process, and then is extended and welded to a surface of a frame. When manufacturing a pattern by using the conventional fine metal mask, firstly, a light source is used to illuminate the fine metal mask and transmits light through the light transmitting region of the fine metal mask such that photoresist, under which a film is provided, on the substrate is exposed to the light. Then, the substrate is subjected to development and etching processes to establish the pattern for evaporation.

SUMMARY

In order to improve quality of a film obtained by evaporation, embodiments of the present disclosure provide a mask sheet and a method of manufacturing mask sheet. The technical schemes are exemplified below.

As an aspect, there is provided a mask sheet comprising: a light shielding region and a light transmitting region, wherein the light shielding region includes an adjoining portion which is located at a position of the light shielding region where adjoins the light transmitting region, and a thickness of other portion of the light shielding region of the mask sheet except the adjoining portion is greater than that of the adjoining portion of the mask sheet.

Optional, the thickness of the other portion of light shielding region of the mask sheet except the adjoining portion is M times of the thickness of the adjoining portion of the mask sheet, where M is greater than or equal to 2 and smaller than or equal to 3.

Optional, a width of the adjoining portion is in a range of 1 mm to 2 mm.

Optional, a thickness of an edge of the adjoining portion is gradually decreased towards the light transmitting region.

As another aspect, there is provided a method of manufacturing a mask sheet comprising:

forming a light transmitting region in a non-transparent substrate, such that other part of the non-transparent substrate except the light transmitting region forms a light shielding region; and forming an adjoining portion within the light shielding region, such that the adjoining portion is located at a position of the light shielding region where adjoins the light transmitting region and a thickness of other portion of the light shielding region of the mask sheet except the adjoining portion is greater than that of the adjoining portion.

Optional, the thickness of the other portion of light shielding region of the mask sheet except the adjoining portion is M times of the thickness of the adjoining portion, where M is greater than or equal to 2 and smaller than or equal to 3.

Optional, a width of the adjoining portion is in a range of 1 mm to 2 mm.

Optional, the step of forming an adjoining portion within the light shielding region comprises:

forming the adjoining portion by performing processes including coating photoresist within the light shielding region, exposure, development and etching, such that a thickness of an edge of the adjoining portion is gradually decreased towards the light transmitting region.

Optional, the step of forming a light transmitting region in the non-transparent substrate comprises:

performing a single patterning process respectively on two faces of the non-transparent substrate to form the light transmitting region.

It should be understood that the above general description and the following detailed description are merely exemplary and interpretive, but not intended to limit the invention.

BRIEF DESCRIPTION OF THE DRAWINGS

In order to more clearly indicate the technical schemes in embodiments of the present disclosure, the drawings that are used to illustrate the embodiments will be described simply. Obviously, the drawings described in the following are merely some embodiments of the present disclosure. However, it is obvious for those skilled in the art to obtain other drawings based on the disclosed drawings without inventive labor.

Specific embodiments of the present disclosure are illustrated by the above drawings and will be described in following text. The drawings and wordings are not intended to limit the scope of the concept of the present disclosure in any manner, instead of illustrating concept of the present disclosure to those skilled in the art with reference to specific embodiments.

DETAILED DESCRIPTION OF THE EMBODIMENTS

In order to more clearly make out objects, the technical schemes and advantages of the present disclosure, embodiments of the present disclosure are further described in detailed with reference to the drawings.

Figure 1:
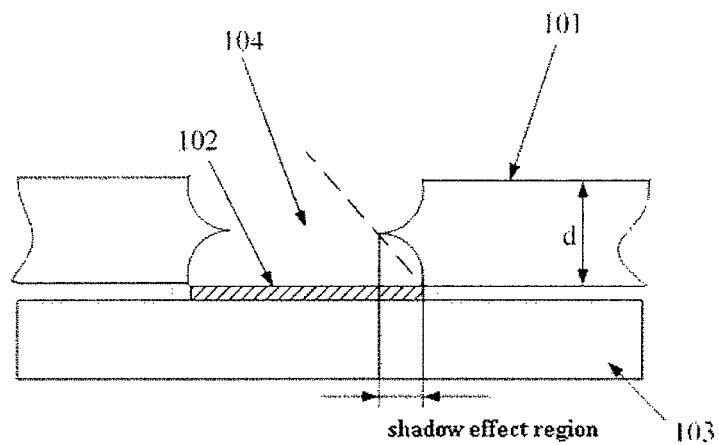
FIG. 1 is a schematic structural view of a fine metal mask in prior art.

A taper-like corner with a radian will be created during etching for manufacturing a fine metal mask. In a fine metal mask as shown in FIG. 1 in prior arts, the light shielding region 101 generally has a thickness d of 100 μm, which is rather great. The greater the thickness is, the more serious a shadow effect during evaporating film 102 is. Thus, the film evaporated in prior art has a poorer quality.

Figure 2:
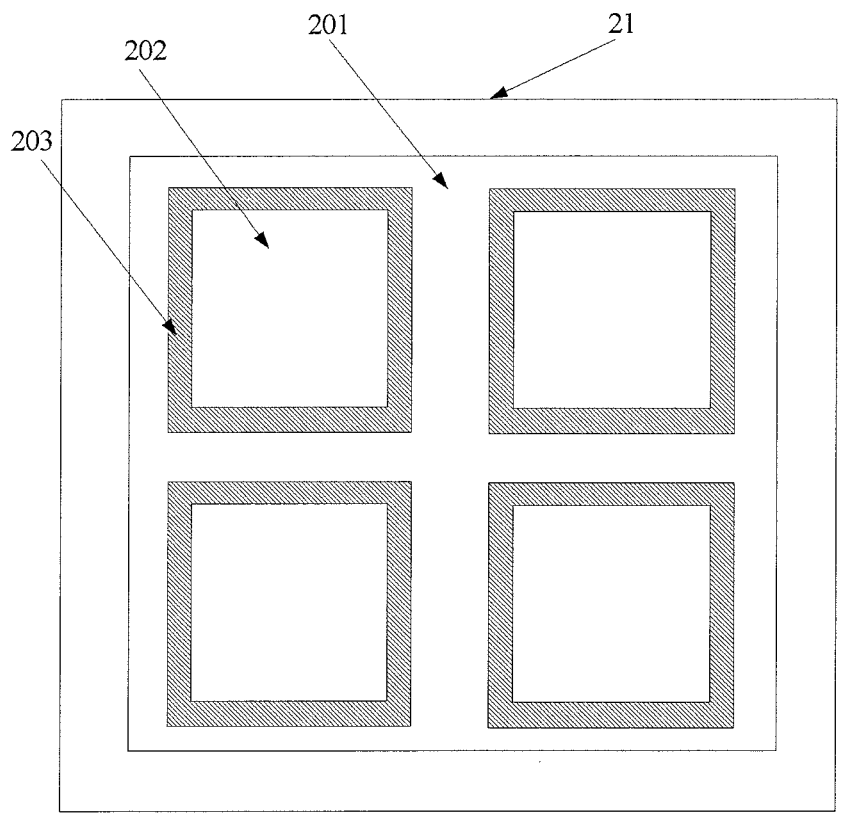
FIG. 2 is a schematic structural view of a mask sheet according to an embodiment of the present disclosure.

Embodiments of the present disclosure provide a mask sheet, as shown in FIG. 2, comprising: a light shielding region 201 and a light transmitting region 202. The light shielding region 201 may include an adjoining portion 203. In an embodiment, the light shielding region 201 is provided with an adjoining portion 203 and the adjoining portion 203 is located at a position of the light shielding region 201 adjoining the light transmitting region 202. A thickness of a portion of the light shielding region 201 of the mask sheet except the adjoining portion 203 is greater than that of the adjoining portion 203 of the mask sheet. In FIG. 2, reference numeral 21 denotes a mask frame, on which the mask sheet is placed.

In sum, the mask sheet according to the embodiments of the present disclosure is provided with the adjoining portion within the light shielding region at a position of the light shielding region where adjoins the light transmitting region, and thickness of other portion of the light shielding region except the adjoining portion is configured to be greater than that of the adjoining of the mask, such that the thickness of the inner edge of the light shielding region adjacent to the light transmitting region is decreased. Compared with the Fine Metal Mask in prior arts, when using the mask sheet according to embodiments of present disclosure, a shadow effect region of the evaporated film is reduced and the quality of the evaporated film is better. Thus, the quality of the evaporated film is improved.

Figure 3:
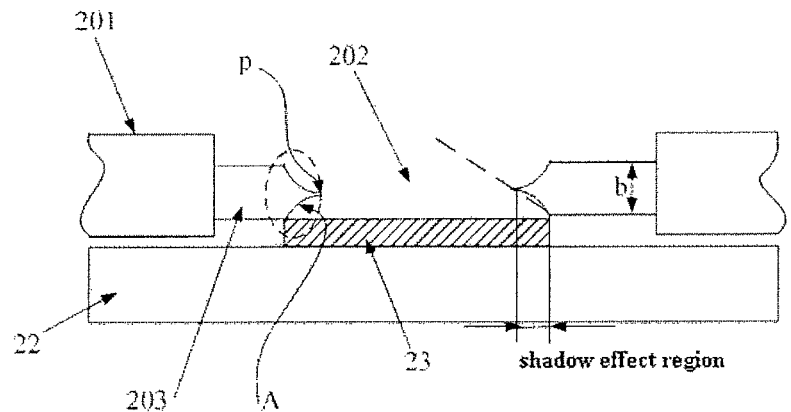
FIG. 3 is a side view of a light transmitting region and a light shielding region therearound of a mask sheet according to an embodiment of the present disclosure.

Further, the thicknesses of the other portions of light shielding region of the mask sheet except the adjoining portion may be M times of the thickness of the adjoining portion of the mask sheet. Preferably, M may be greater than or equal to 2, and smaller than or equal to 3. FIG. 1 shows a schematic cross sectional view of the Fine Metal Mask in prior arts. In FIG. 1, reference numeral 103 denotes a substrate and reference numeral 104 denotes a light transmitting region. A thickness d of the light shielding region 101 of the Fine Metal Mask in FIG. 1 is 100 μm. FIG. 3 shows a schematic cross sectional view of the mask sheet according to an embodiment of present disclosure, comprising a light transmitting region 202 and a light shielding region around the light transmitting region 202. As shown in FIG. 3, the thickness b of the adjoining portion 203 of the mask sheet located at a position where the light shielding region 201 adjoins the light transmitting region 202 of the mask sheet is in a range of 30 μm to 50 μm. That is, the thickness of an inner edge of the light shielding region 201 adjacent to the light transmitting region is in a range of 30 μm to 50 μm. Compared with the shadow effect region established in the evaporated film in prior art, as shown in FIG. 1, a shadow effect region of an evaporated film formed according to the embodiment of the present disclosure is reduced due to the decreased thickness of the inner edge of the light shielding region 201, thereby improving the quality of the evaporated film. It is noted that, in FIG. 3, reference numeral 22 denotes a substrate and reference numeral 23 denotes the evaporated film. In addition, the substrate 22 in FIG. 3 will be in contact with a front face of the mask sheet.

Figure 4:
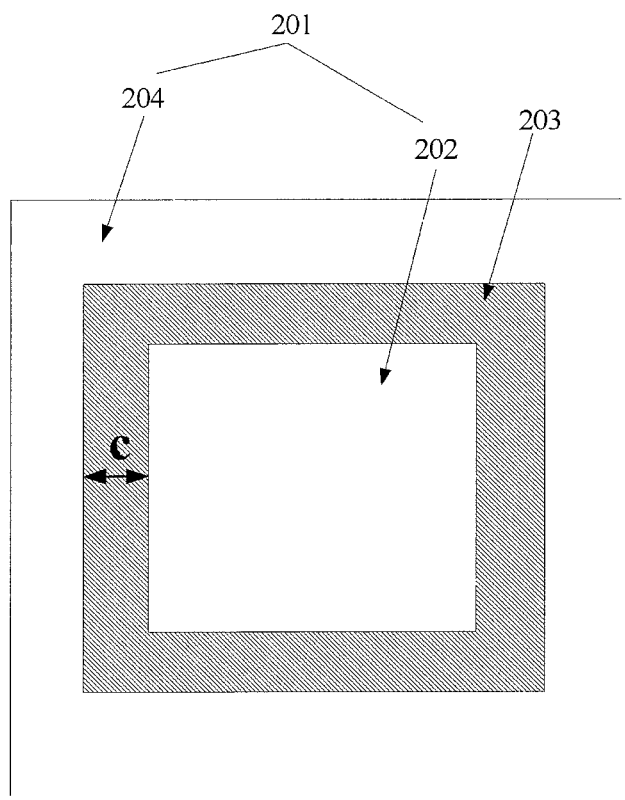
FIG. 4 is a schematic structural view of an adjoining portion with a width of a mask sheet according to an embodiment of the present disclosure.

FIG. 4 illustrates a mask sheet according to an embodiment of the present disclosure. As shown in FIG. 4, a width c of the adjoining portion 203 is in a range of 1 mm to 2 mm. That is, the width c is greater than or equal to 1 mm and equal to or smaller than 2 mm. As the width of the adjoining portion obtained is relatively small, the strength of the mask sheet is less affected by the formation of the adjoining portion.

Further, as indicated by the portion surrounding by the dash line shown in FIG. 3, a thickness of an edge of the adjoining portion 203 is gradually decreased towards the light transmitting region.

In sum, the mask sheet according to the embodiments of the present disclosure is provided with the adjoining portion within the light shielding region at a position of the light shielding region where adjoins the light transmitting region, and thicknesses of other portion of the light shielding region except the adjoining portion is greater than that of the adjoining of the mask, such that the thickness of the inner edge of the light shielding region adjacent to the light transmitting region is decreased while the width of the adjoining portion obtained is relatively small, thereby the entire formation of the adjoining portion has less influence on the strength of the mask sheet. Compared with the Fine Metal Mask in prior arts, when using the mask sheet according to embodiments of present disclosure, a shadow effect region of the evaporated film is smaller and the quality of the evaporated film is better. Thus, the quality of the evaporated film is improved.

Figure 5:
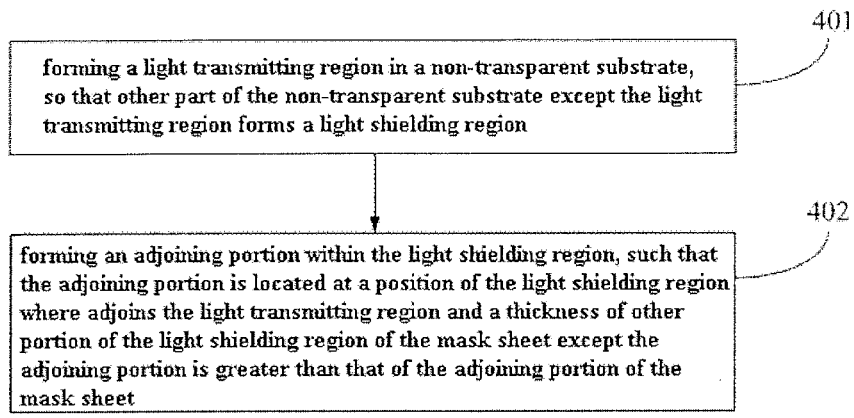
FIG. 5 is a flow chart of a method of manufacturing a mask sheet according to an embodiment of the present disclosure.

Embodiments of the present disclosure provide a method of manufacturing a mask sheet, as shown in FIG. 5, comprising:

Step 401: forming a light transmitting region in a non-transparent substrate, so that other part of the non-transparent substrate except the light transmitting region forms a light shielding region.

Figure 6:
FIG. 6 is a side view of a non-transparent substrate with one face coated with photoresist according to an embodiment of the present disclosure.
Figure 7:
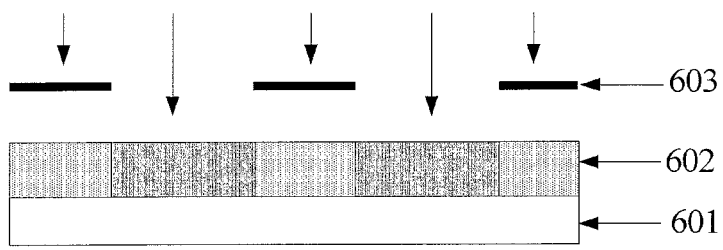
FIG. 7 is a side view of a non-transparent substrate with one face being exposed according to an embodiment of the present disclosure.
Figure 8:
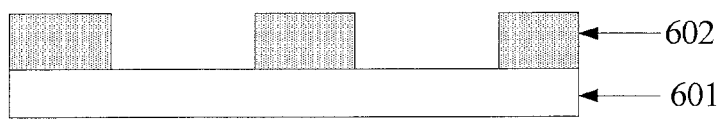
FIG. 8 is a side view of a non-transparent substrate whose one face is developed according to an embodiment of the present disclosure.
Figure 9:
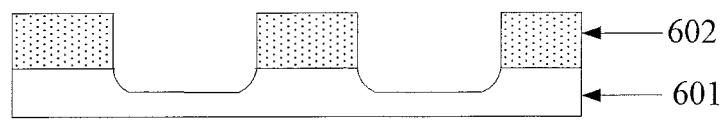
FIG. 9 is a side view of a non-transparent substrate whose one face is etched according to an embodiment of the present disclosure.
Figure 10:
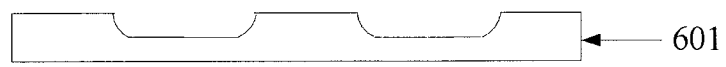
FIG. 10 is a side view of a non-transparent substrate with photoresist on one face thereof being peeled off according to an embodiment of the present disclosure.

Specifically, step 401 may include forming the light transmitting region by performing a patterning process on either side of the non-transparent substrate respectively. A single patterning process is implemented to one face of the non-transparent substrate. The patterning process generally includes processes of coating photoresist, exposure, development, etching and photoresist peeling-off. The coated photoresist may be positive photoresist, or may be negative photoresist. A coating process is illustrated below with reference to positive photoresist that is used as the photoresist to be coated. The specific process may be implemented as follows: a photoresist 602 is uniformly coated on the non-transparent substrate 601 firstly, so that a coated structure is obtained, as shown in FIG. 6; the photoresist is then exposed selectively based on an light shielding effect with an existing mask 603, thereby completing the exposure process as shown in FIG. 7; subsequently, development is performed, as shown in FIG. 8, in which the exposed photoresist is dissolved and the un-exposed photoresist is cured based on chemical action; whereafter, the non-transparent substrate after development is subjected to etching, as shown in FIG. 9, so that a film/films covering on surface of the non-transparent substrate is/are selectively etched off depending on the cured photoresist after development, and the etching process may be a dry etch process or a wet etch process and may be determined according to actual demands during manufacturing; and finally, the photoresist is peeled off to obtain the structure with a side view as shown in FIG. 10.

Figure 11:
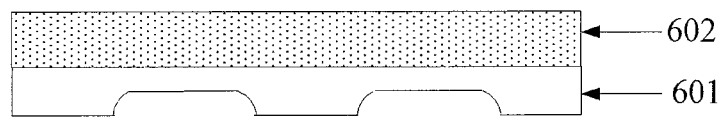
FIG. 11 is a side view of a non-transparent substrate with another face coated with photoresist according to an embodiment of the present disclosure.
Figure 12:
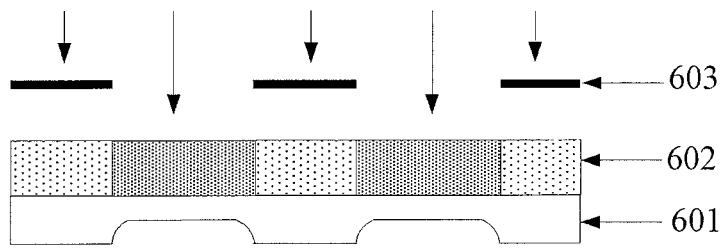
FIG. 12 is a side view of a non-transparent substrate with another face being exposed according to an embodiment of the present disclosure.
Figure 13:
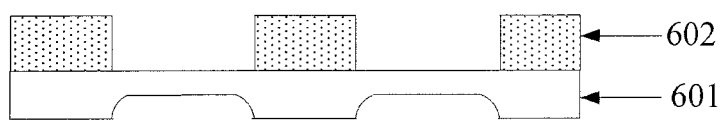
FIG. 13 is a side view of a non-transparent substrate with another face being developed according to an embodiment of the present disclosure.
Figure 14:
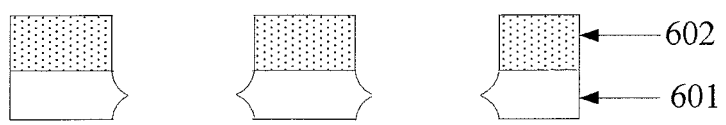
FIG. 14 is a side view of a non-transparent substrate with another face being etched according to an embodiment of the present disclosure.
Figure 15:
FIG. 15 is a side view of a light transmitting region formed according to an embodiment of the present disclosure.

Similarly, a single patterning process is implemented to the other face of the non-transparent substrate. The patterning process generally includes processes of photoresist coating, exposure, development, etching and photoresist peeling-off. The coated photoresist may be positive photoresist, or may be negative photoresist. A coating process is illustrated below with reference to positive photoresist that is used as the photoresist to be coated. The specific process may be implemented as follows: photoresist 602 is uniformly coated on the non-transparent substrate 601 firstly, so that a coated structure is obtained, as shown in FIG. 11; the photoresist is then exposed selectively based on an light shielding effect with the existing mask 603, thereby completing the exposure process as shown in FIG. 12; subsequently, development is performed, as shown in FIG. 13, in which the exposed photoresist is dissolved and the un-exposed photoresist is cured based on chemical action; whereafter, the non-transparent substrate after development is subjected to etching, as shown in FIG. 14, in which a film/films covering on surface of the non-transparent substrate is/are selectively etched off depending on the cured photoresist after development; and finally, the photoresist is peeled off, so that the light transmitting region 202 is formed, as shown in FIG. 15. The other region of the non-transparent substrate 601 except the light transmitting region 202 may be the light shielding region 201.

The mask sheet provided according to embodiments of the present disclosure is adapted to an evaporation process in prior arts. The specific process regarding the evaporation process may be referred to the prior arts and is not repeatedly described herein.

Figure 16:
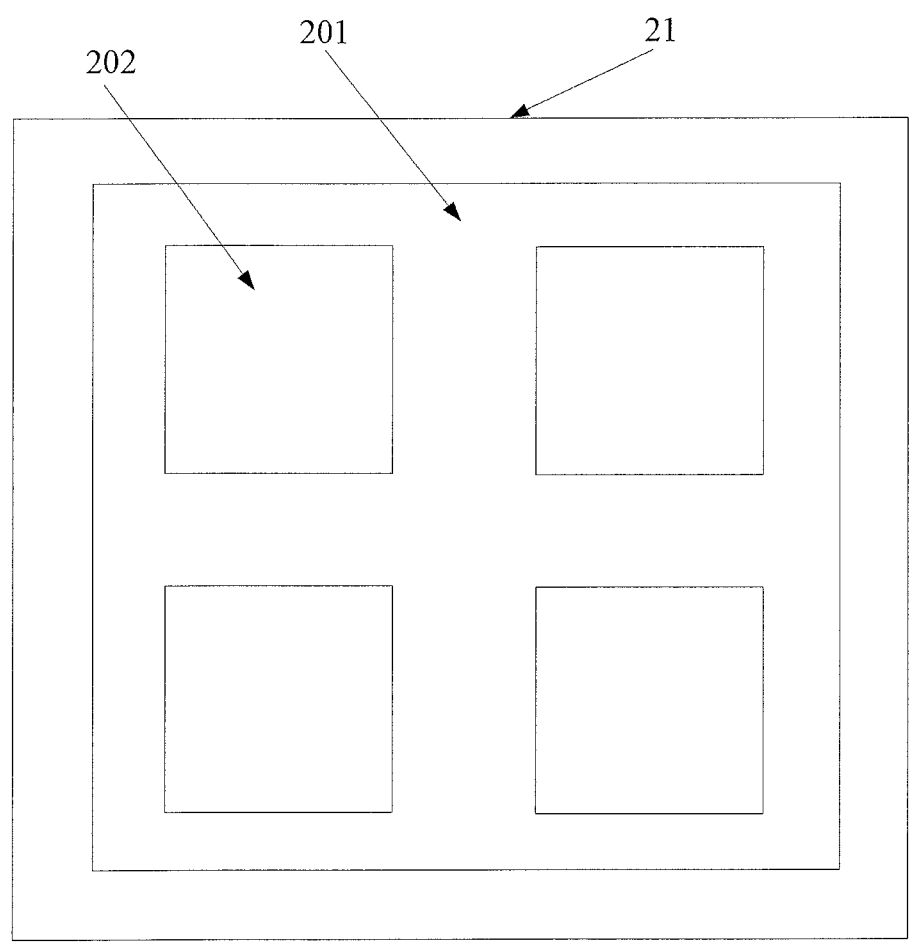
FIG. 16 is a top view of a light transmitting region which is formed by performing photoresist coating, exposure, development and etching on two faces of a non-transparent substrate according to an embodiment of the present disclosure.

After step 401, the light transmitting region is formed. FIG. 16 is a top view of the light transmitting region, where reference numeral 21 denotes a mask frame, reference numeral 201 denotes the light shielding region of the mask sheet and reference numeral 202 denotes the light transmitting region of the mask sheet.

The method further comprises a step 402: forming an adjoining portion within the light shielding region, such that the adjoining portion is located at a position of the light shielding region where adjoins the light transmitting region and a thickness of other portion of the light shielding region of the mask sheet except the adjoining portion is greater than that of the adjoining portion of the mask sheet.

The adjoining portion is formed by completing step 402 on the basis of step 401. Step 402 may specifically include: forming the adjoining portion by performing processes of photoresist coating within the light shielding region, exposure, development and etching. Further, a thickness of an edge of the adjoining portion is gradually decreased towards the light transmitting region. The adjoining portion formed in step 402 by coating photoresist, exposure, development and etching, the adjoining portion has a structure shown in FIG. 2. The specific processes of step 402 may be implemented with reference to the patterning processes in step 401. It is noted that the region that is exposed and developed in step 402 completely covers the region that is exposed and developed in step 401, and preferably, a distance between a boundaries of the two regions after the exposure and development processes may be in a range of 1 mm to 2 mm. A width of the adjoining portion is in a range of 1 mm to 2 mm. Further, etching depth obtained in step 402 is ½ to ⅓ times of the thickness of the light shielding region of the mask sheet obtained in step 401, such that a width of the portion of light shielding region of the mask sheet except the adjoining portion is M times of the thickness of the adjoining portion of the mask sheet. Preferably, M may be greater than or equal to 2, and smaller than or equal to 3. It is noted that, when forming the adjoining portion within the light shielding region, two side faces of the light shielding region will be respectively subject to processes including photoresist coating, exposure, development, etching and the like.

The light shielding region of the mask sheet formed in step 402 has an inner edge with a reduced thickness and thus the shadow effect region of the evaporated film is reduced, thereby the evaporation film having an improving quality. Meanwhile, as the formed adjoining portion has a relative smaller width, the mask sheet is less affected by the entire formation.

It is noted that the steps of the method of manufacturing the mask sheet according to embodiments of the present disclosure may be suitably adjusted in term of operation order, and may also be added or reduced correspondingly according to actual situations. Any methods that are obtained within the disclosed content by those skilled in the art shall be covered by the protective scope of the present disclosure. For example, the above step 401 and step 402 in the method according to the embodiment are not needed to be operated in the above order. In another embodiment of the present disclosure, step 402 may be performed firstly so as to perform etch process in the light transmitting region and the adjoining portion such that the thickness of the region of the mask sheet where the light transmitting region and the adjoining portion are located is reduced; subsequently, etch process is performed on the region of the mask sheet where the light transmitting region is located, so as to form the light transmitting region.

It is obvious that the above described method embodiments may be referred correspondingly to the above described device embodiments and are not repeatedly described for convenience and concision.

In sum, with the method of manufacturing a mask sheet according to the embodiments of the present disclosure, the adjoining portion is formed within the light shielding region at a position of the light shielding region where adjoins the light transmitting region, and thickness of other portion of the light shielding region except the adjoining portion is greater than that of the adjoining of the mask, such that the thickness of the inner edge of the light shielding region is decreased while the width of the adjoining portion obtained is relatively small, thereby the entire formation of the adjoining portion has less influence on the strength of the mask sheet. Compared with the Fine Metal Mask in prior arts, when using the mask sheet provided according to embodiments of present disclosure, a shadow effect region of the evaporated film is smaller and the quality of the evaporated film is better. Thus, the quality of the evaporated film is improved.

The above described are merely embodiments of the present disclosure, and not intended to limit the present disclosure. Any modification, substitution and improvement made within the spirit and principle of the present disclosure shall be included in the protective scope of the present invention.

The invention claimed is:

1. A mask sheet, comprising: a light shielding region and a light transmitting region,
   wherein the light shielding region includes an adjoining portion which is located to adjoin the light transmitting region, and which has a thickness less than that of remainder portion of the light shielding region of the mask sheet.

2. The mask sheet according to claim 1, wherein
   the thickness of the remainder portion of light shielding region of the mask sheet except the adjoining portion is b times of the thickness of the adjoining portion of the mask sheet, where b is greater than or equal to 2 and smaller than or equal to 3.

3. The mask sheet according to claim 2, wherein a width of the adjoining portion is in a range from 1 mm to 2 mm.

4. The mask sheet according to claim 1, wherein in that, a width of the adjoining portion is in a range from 1 mm to 2 mm.

5. The mask sheet according to claim 1, wherein
   an edge of the adjoining portion is gradually decreased in thickness towards the light transmitting region.

6. A method of manufacturing a mask sheet, comprising:
   forming a light transmitting region in a non-transparent substrate, such that other-remainder part of the non-transparent substrate except the light transmitting region forms a light shielding region; and
   forming an adjoining portion within the light shielding region, such that the adjoining portion is located to adjoin the light transmitting region and has a thickness less than that of remainder portion of the light shielding region of the mask sheet.

7. The method according to claim 6, wherein
   the thickness of the remainder portion of light shielding region except the adjoining portion is M times of the thickness of the adjoining portion, where b is greater than or equal to 2 and smaller than or equal to 3.

8. The method according to claim 6, wherein
   a width of the adjoining portion is in a range from 1 mm to 2 mm.

9. The method according to claim 6, wherein forming the adjoining portion comprises:
   forming the adjoining portion by performing processes of coating photoresist within the light shielding region, exposing, developing and etching the photoresist, such that an edge of the adjoining portion is gradually decreased in thickness towards the light transmitting region.

10. The method according to claim 6, wherein forming the light transmitting region comprises:
    performing a patterning process respectively on both faces of the non-transparent substrate to form the light transmitting region.

11. The method according to claim 7, wherein forming the light transmitting region comprises:
    performing a patterning process respectively on both faces of the non-transparent substrate to form the light transmitting region.

12. The method according to claim 8, wherein forming the light transmitting region comprises:
    performing a patterning process respectively on both faces of the non-transparent substrate to form the light transmitting region.

13. The method according to claim 9, wherein forming the light transmitting region comprises:
    performing a patterning process respectively on both faces of the non-transparent substrate to form the light transmitting region.

* * * * *